United States Patent
Puetz et al.

(10) Patent No.: US 11,697,712 B2
(45) Date of Patent: Jul. 11, 2023

(54) TEMPORARY PROTECTIVE LACQUER OPTICAL ELEMENT

(71) Applicant: tooz technologies GmbH, Aalen (DE)

(72) Inventors: Joerg Puetz, Aalen (DE); Hans-Joachim Weippert, Aalen (DE); Matthias Krieg, Heidenheim (DE)

(73) Assignee: tooz technologies GmbH, Aalen (DE)

( * ) Notice: Subject to any disclaimer, the term of this patent is extended or adjusted under 35 U.S.C. 154(b) by 1126 days.

(21) Appl. No.: 16/312,918

(22) PCT Filed: May 22, 2017

(86) PCT No.: PCT/EP2017/062237
§ 371 (c)(1),
(2) Date: Dec. 21, 2018

(87) PCT Pub. No.: WO2017/220271
PCT Pub. Date: Dec. 28, 2017

(65) Prior Publication Data
US 2019/0330480 A1 Oct. 31, 2019

(30) Foreign Application Priority Data
Jun. 22, 2016 (DE) .......................... 102016111418.9

(51) Int. Cl.
*C08G 75/045* (2016.01)
*G02B 27/01* (2006.01)
(Continued)

(52) U.S. Cl.
CPC ......... *C08G 75/045* (2013.01); *C08G 18/288* (2013.01); *C08G 18/3855* (2013.01);
(Continued)

(58) Field of Classification Search
CPC ...... C09D 5/20; C09D 147/00; C09D 181/02; C09D 181/04; C09D 181/10; G02B 1/14;
(Continued)

(56) References Cited

U.S. PATENT DOCUMENTS 4,039,723 A * 8/1977 Moyer .................. C07C 323/00
554/102
5,908,876 A * 6/1999 Fujii ...................... G02B 1/041
522/182

(Continued)

FOREIGN PATENT DOCUMENTS

CN 1869086 A 11/2006
CN 101153097 A 4/2008
(Continued)

OTHER PUBLICATIONS

International Preliminary Report on Patentability rendered by the International Bureau of WIPO for PCT/EP2017/062237, dated Jan. 3, 2019, 8 pages.

(Continued)

*Primary Examiner* — Ling Siu Choi
*Assistant Examiner* — David L Miller
(74) *Attorney, Agent, or Firm* — Skaar Ulbrich Macari, P.A.

(57) ABSTRACT

A lacquer composition is provided, comprising 20%-79.9% by weight, based on the total weight of the composition, of a thiol compound having two or more thiol groups, 20%-79.9% by weight, based on the total weight of the composition, of a compound having two or more carbon-carbon double bonds and 0.1%-10% by weight, based on the total weight of the composition, of a separating agent having an alkyl radical having 4-20 carbon atoms, where the alkyl radical is unsubstituted or fluorine-substituted and the alkyl radical is bonded to a functional group. Also provided are (Continued)

the use of this lacquer composition as a protective lacquer on an optical surface of an optical element in the production of the optical element, and an optical element comprising the protective lacquer.

11 Claims, 1 Drawing Sheet

(51) Int. Cl.
| | |
|---|---|
| C09D 147/00 | (2006.01) |
| C09D 181/04 | (2006.01) |
| C08G 75/02 | (2016.01) |
| C08G 75/00 | (2006.01) |
| C08G 75/12 | (2016.01) |
| C08G 18/28 | (2006.01) |
| C09D 181/02 | (2006.01) |
| C08G 18/38 | (2006.01) |
| C08G 18/52 | (2006.01) |
| C08G 75/04 | (2016.01) |
| C08G 18/50 | (2006.01) |
| G02B 1/14 | (2015.01) |
| C09D 5/20 | (2006.01) |
| G02B 1/12 | (2006.01) |
| C08F 38/00 | (2006.01) |
| C08G 75/0204 | (2016.01) |
| C08G 75/14 | (2006.01) |
| C08G 75/26 | (2006.01) |
| C09D 181/10 | (2006.01) |

(52) U.S. Cl.
CPC ..... *C08G 18/3863* (2013.01); *C08G 18/3876* (2013.01); *C08G 18/5072* (2013.01); *C08G 18/52* (2013.01); *C08G 75/00* (2013.01); *C08G 75/02* (2013.01); *C08G 75/04* (2013.01); *C08G 75/12* (2013.01); *C09D 147/00* (2013.01); *C09D 181/02* (2013.01); *C09D 181/04* (2013.01); *G02B 27/0172* (2013.01); *C08F 38/00* (2013.01); *C08G 18/3857* (2013.01); *C08G 18/3859* (2013.01); *C08G 18/3868* (2013.01); *C08G 75/0204* (2013.01); *C08G 75/14* (2013.01); *C08G 75/26* (2013.01); *C09D 5/20* (2013.01); *C09D 181/10* (2013.01); *G02B 1/12* (2013.01); *G02B 1/14* (2015.01); *G02B 2027/0178* (2013.01)

(58) Field of Classification Search
CPC .......... G02B 1/12; C08G 18/10; C08G 18/12; C08G 18/18; C08G 18/1808; C08G 18/288; C08G 18/3855; C08G 18/3857; C08G 18/3859; C08G 18/3863; C08G 18/8365; C08G 18/3876; C08G 18/3868; C08G 18/5072; C08G 18/52; C08G 71/011; C08G 75/02; C08G 75/00; C08G 75/0204; C08G 75/04; C08G 75/045; C08G 75/12; C08G 75/14; C08G 75/26; C08G 18/3865
See application file for complete search history.

(56) References Cited

U.S. PATENT DOCUMENTS

| | | |
|---|---|---|
| 2002/0183415 A1 | 12/2002 | Szum et al. |
| 2005/0158001 A1 | 7/2005 | Fabian et al. |
| 2009/0030113 A1 | 1/2009 | Glockner et al. |
| 2015/0099858 A1* | 4/2015 | Cai .................. C08G 75/14 528/376 |
| 2015/0165653 A1* | 6/2015 | Medina ............ B29D 11/00038 264/1.7 |
| 2016/0032160 A1 | 2/2016 | Koh et al. |
| 2016/0114542 A1 | 4/2016 | Quere et al. |
| 2016/0282621 A1 | 9/2016 | Widulle et al. |

FOREIGN PATENT DOCUMENTS

| | | | |
|---|---|---|---|
| CN | 101353546 A | 1/2009 | |
| DE | 102012210185 A1 * | 12/2013 | ............... G01N 1/30 |
| DE | 102012210185 A1 | 12/2013 | |
| EP | 2065414 A1 | 6/2009 | |

OTHER PUBLICATIONS

Bruno Bock Thiochemicals "Thiocure® Tempic Tris[2-(3-mercaptopropionyloxy)ethyl]isocyanurat", Apr. 15, 2016, 1 page.
ChemSpider, Search and share chemistry "triallyl-1,3,5-triazine-2,4,6-trione", Apr. 15, 2016, 1 page.

* cited by examiner

TEMPORARY PROTECTIVE LACQUER OPTICAL ELEMENT

PRIORITY

This application claims the benefit of German Patent Application No. 102016111418.9 filed on Jun. 22, 2016, which is hereby incorporated herein by reference in its entirety.

FIELD

The invention relates to a lacquer composition from which a protective lacquer can be produced by polymerization, and to the use of the lacquer composition as temporary protective lacquer for optical surfaces of optics elements. The invention further relates to an optics element comprising the protective lacquer.

BACKGROUND

Complex optical components as used in data glasses, for example, for displaying image information often contain different functional surfaces in a very tight space and in direct proximity. For instance, it may be the case that the transmissive input surface is directly adjacent to a reflective surface. In general, in the production process for such optics elements, non-functional surfaces are coated with an absorber lacquer, i.e. a highly absorptive black lacquer, which is supposed to eliminate incorrect light. The absorber lacquer is advantageously likewise applied to highly reflective surfaces in order to protect these from environmental effects.

Among the reasons why the manufacturing and finishing of such optics elements is found to be difficult are firstly that reflective and non-functional surfaces have to be coated with the absorber lacquer to a sharp edge, and secondly that transmissive surfaces, for example an input surface and any output surface present, must not be contaminated with the absorber lacquer in order not to lose any transmission or to produce image defects.

SUMMARY

An object of the invention to reliably protect optical surfaces of optics elements from chemical and physical effects in their production process, with accurate applicability and residue-free removability of the protection.

Provided is a lacquer composition comprising
(A) 20-79.9% by weight, based on the total weight of the composition, of a thiol compound having two or more thiol groups,
(B) 20-79.9% by weight, based on the total weight of the composition, of a compound having two or more carbon-carbon double bonds and
(C) 0.1-10% by weight, based on the total weight of the composition, of a separating agent having at least one alkyl radical having 4-20 carbon atoms, wherein the alkyl radical is unsubstituted or fluorine-substituted and the alkyl radical is bonded to a functional group.

The object is further achieved by the use of this lacquer composition as protective lacquer, which is removable again by pulling it off, on an optical surface of an optics element in the production thereof. The object is further achieved by an optics element having an optical surface, wherein the protective lacquer has been applied to at least part of the optical surface.

The lacquer composition can surprisingly be used to produce a protective lacquer that offers an excellent balance between adhesion to optical surfaces of optics elements for protection thereof and detachability. At the same time, an optical surface of optics elements is reliably sealed off from subsequent processes such as coating or cleaning that often involve wet processing steps or treatments under reduced pressure or by means of plasma, and the protective lacquer is stable to subsequent process steps, for example thermal treatments or chemical reagents and solvents. On the other hand, the protective lacquer does not chemically attack the optical surfaces of customary optics elements and it is readily removable again (can be pulled off) after processing by mechanical action.

The polymer system is developed based on the principle of the free-radical polymerization of thiol-ene systems. According to certain embodiments of the invention, a defined amount of a separating agent is added thereto. The separating agent is a compound having one or more alkyl radical(s) having 4-20 carbon atoms of a functional group. Without the invention being bound thereto, it is assumed that the separating agent, in the course of the curing process, accumulates at the interface, as a result of which the protective lacquer can be removed again from an optical surface to be protected without any problem.

"Comprising" a compound, for example a thiol compound, is understood as usual to mean that the composition contains or comprises one or more of these compounds. In this context, the invention relates to a composition comprising one or more thiol compounds each having two or more thiol groups, one or more compounds having two or more carbon-carbon double bonds and one or more separating agents, each of which has one or more alkyl radical(s) having 4-20 carbon atoms, where the alkyl radical is bonded to a functional group. An alkyl radical or an alkyl group is understood to mean a group composed of carbon and hydrogen atoms which is not aromatic, where an alkyl radical in the context of the invention may also contain one or more double bonds, i.e. may be an alkane or alkene radical. The alkyl group or alkyl radical may be unsubstituted or fluorine-substituted. Among the fluorinated alkyl radicals, preference is given to partly fluorinated alkyl radicals, meaning that only some of the hydrogen atoms are substituted by fluorine.

Component (A) can be a thiol compound having two or more thiol groups (—SH groups). Preferred thiol compounds are mercapto esters and here especially mercapto esters having two or more ester groups and two or more thiol groups. Preferred mercapto esters are mercaptoacetates, 2- and 3-mercaptopropionates, which have advantageous reactivity in combination with the further components of the lacquer composition of the invention. Preference is further given to mercapto esters wherein the carboxylic acid groups have been esterified with polyfunctional alcohols. Preferred polyfunctional alcohols are the polyfunctional alcohols specified hereinafter in the form of their mercapto esters. Preference is given to mercapto esters having 3 or more thiol groups and 3 or more ester groups, especially pentaerythritol tetra(3-mercaptopropionate) (PTMP), trimethylolpropane tri (3-mercaptopropionate) (TPMP), ethylene glycol di(3-mercaptopropionate) (GDMP), pentaerythritol tetra(mercaptoacetate) (PTMA), trimethylolpropane tri(mercaptoacetate) (TPMA), ethylene glycol di(mercaptoacetate) (GDMA), tris [2-(3-mercaptopropionyloxy)ethyl]isocyanurate (TEMPIC) and tris[2-(2-mercaptopropionyloxy)ethyl]isocyanurate (TETLIC). Tris[2-(3-mercaptopropionyloxy)ethyl]isocyanurate and trimethylolpropane tri-(3-mercaptopropionate) have been found to be particularly advantageous.

In a further embodiment, component (A) is a thioether having two or more thiol groups. Such a thioether thus contains the RSR' moiety and two or more free SH groups. One example of such a thioether is 2,3-bis(2-mercaptoethylsulfanyl)propane-1-thiol.

Component (A) is present in an amount of 20-79.9% by weight, based on the total weight of the lacquer composition. Preference is given to 25-74.9% by weight, especially 30-69.9% by weight.

Component (B) is a compound having two or more carbon-carbon double bonds. Particularly with regard to reactivity, preference is given to compounds having terminal carbon-carbon double bonds, such as acrylates and methacrylates, vinyl and vinyloxy compounds, and especially allyl derivatives. Among these, preference is given to allyl esters of phthalic acid, isophthalic acid and terephthalic acid, allyl ethers of pentaerythritol and trimethylolpropane, and 2,4,6-triallyloxy-1,3,5-triazine. Particularly advantageously, it is possible to use 1,3,5-triallyl-1,3,5-triazine-2,4,6-trione. 1,3,5-Triallyl-1,3,5-triazine-2,4,6-trione can especially be used in combination with the abovementioned mercapto esters and here especially together with tris[2-(3-mercaptopropionyloxy)ethyl]isocyanurate and/or trimethylolpropane tri(3-mercaptopropionate). Component (B) is present in an amount of 20-79.9% by weight, based on the total weight of the lacquer composition. Preference is given to 25-74.9% by weight, especially 30-69.9% by weight.

It will be apparent that components (A), (B) and (C) of the lacquer composition, optionally together with further components of the composition, together add up to 100% by weight. The amounts of the 20-79.9% by weight of the thiol compound having two or more thiol groups (A), the 20-79.9% by weight of the compound having two or more carbon-carbon double bonds (B) and the 0.1-10% by weight of separating agents (C) chosen by the person skilled in the art, together with any further components present, such as additives, fillers, solvents, oligomers etc., will thus together give 100% by weight.

In the lacquer composition herein, a central role is played by component (C), the separating agent, having an alkyl radical having 4-20 carbon atoms, wherein the alkyl radical is bonded to a functional group. The separating agent may contain two or more alkyl groups that then each have 4-20 carbon atoms and are bonded to the functional group. This separating agent ensures that the protective lacquer producible from the lacquer composition can be readily removed again, especially from optical surfaces of optics elements.

The alkyl radical of component (C) may be saturated or unsaturated. It may also be unbranched, branched or cyclic. Examples of saturated alkyl radicals are butyl, pentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl. Preference is given to 1-alkyl radicals. In a preferred embodiment of the invention, the separating agent (C) has one or more alkyl radicals, where the one alkyl radical has 7-20 carbon atoms or the multiple alkyl radicals together have 7-20 carbon atoms. Examples of a separating agent having 8 carbon atoms would be octylamine or dibutylamine or dibutyl phosphate. The multiple alkyl radicals may have the same or different lengths. A dialkyl compound as separating agent having 8 carbon atoms altogether could have, for example, one radical having 2 carbon atoms and one having 6, one radical having 3 carbon atoms and one having 5, or two radicals having 4 carbon atoms. Particular preference is given to separating agents having one or more alkyl radicals, where the one or more alkyl radical(s) together have 8-16 carbon atoms. The most preferred separating agents are dodecylamine and dibutyl phosphate.

The separating agent may be present as additive in the lacquer composition, meaning that it is not incorporated into the polymer. Among these separating agents, preference is given to amines and phosphates, meaning that the separating agents are alkylamines such as primary alkylamines (monoalkylamine), secondary alkylamines (dialkylamine) or tertiary alkylamines (trialkylamine), alkyl phosphates, dialkyl phosphates and trialkyl phosphates. Among these alkylamines that are present as additives, particular preference is given to dodecylamine, tetradecylamine and hexadecylamine.

A separating agent present as an additive, after the polymer in the form of the protective lacquer has been pulled off, generally forms a residue film that can be wiped off with a cloth, for example, in the production process.

Particularly advantageously, the separating agent may have a reactive functionality, meaning that it is incorporated in the polymerization of the lacquer composition, which enables particularly low-residue removal of the protective lacquer. Preferably, the functional group here is a thiol or mercaptan group (—SH) or a carbon-carbon double bond, i.e. the separating agent is an alkyl mercaptan or an alkene. In these, the alkyl radical may again be constructed as described above. Preference is given to 1-alkyl mercaptans having 7-20 carbon atoms, especially having 8-18 carbon atoms and most preferably having 10-16 carbon atoms. Particularly preferred separating agents are 1-decyl mercaptan, 1-dodecyl mercaptan, 1-tetradecyl mercaptan and 1-hexadecyl mercaptan. Suitable alkenes are especially those with a terminal double bond, i.e. the functional group is a vinyl group. The separating agent may thus preferably be a 1-alkene having 9-22 carbon atoms, especially 10-20 carbon atoms and most preferably 12-18 carbon atoms, especially 1-dodecene, 1-tetradecene, 1-hexadecene and 1-octadecene.

A further option is an already chemically crosslinked separating agent, for example an oligomeric (prepolymeric) polythiol which is obtained by the reaction of a 1-mercaptoalkane with a deficiency of a suitable diisocyanate. It is likewise possible to use prepolymers formed from polyfunctional thiols by reaction with a deficiency of a 1-alkyl isocyanate, for example octadecyl isocyanate.

The separating agent is present in the lacquer composition of the invention in an amount of 0.1-10% by weight, based on the total weight of the composition. Preference is given to 0.2-5% by weight, especially 0.5-3% by weight.

A preferred lacquer composition according to one example embodiment comprises:
 (A) 30-69.8% by weight, based on the total weight of the composition, of a thiol compound having two or more thiol groups,
 (B) 30-69.8% by weight, based on the total weight of the composition, of a compound having two or more carbon-carbon double bonds and
 (C) 0.2-5% by weight, based on the total weight of the composition, of a separating agent having an alkyl radical having 4-20 carbon atoms, wherein the alkyl radical is unsubstituted or fluorine-substituted and the alkyl radical is bonded to a functional group.

The lacquer can be made comparatively mobile (low viscosity) in order to be able to very rapidly and completely fill an optical area, for example in the form of a depression. In other embodiments, it may be advantageous to establish a higher viscosity, in order, for example, to achieve selective coverage of an optical surface. For a higher viscosity, in an advantageous embodiment of the lacquer composition, an oligomer may be added. An oligomer in the context of the invention is understood to mean an organic compound formed from repeat units of monomers, where the number of monomers (sum total of all monomers) has a number average of 3-100, especially 5-70. This oligomer is also referred to hereinafter as prepolymer.

In one example embodiment, for an elevated viscosity, component (A) is an oligomer. Preferably, the lacquer composition therefore includes 20-79.9% by weight of an oligomer or prepolymer, based on the total weight of the lacquer composition, especially 30-69.5% by weight.

The oligomer is preferably an oligomeric thiourethane, especially having free thiol groups. Thiourethanes are known to those skilled in the art. They can be prepared from a thiol and an isocyanate. Preference is given to oligomeric thiourethanes formed from a mercapto ester having two or more thiol groups (mercapto ester monomer) and an isocyanate having two or more isocyanate groups (isocyanate monomer). Preference is further given to oligomeric thiourethanes formed from a thioether having two or more thiol groups and an isocyanate having two or more isocyanate groups. Examples of isocyanates are TDI (toluene 2,4-diisocyanate), HMDI (hexamethylene diisocyanate) and MDI (methylene diphenyl diisocyanate).

The total number of thiol and isocyanate monomers present in this oligomer has a number average of 3-100. In this sense, the PTMP-XDI-PTMP-XDI-PTMP oligomer, for example, would include 5 monomers. Preference is given to oligomers of pentaerythritol tetra(3-mercaptopropionate) (PTMP) with xylylene diisocyanate (XDI), of pentaerythritol tetra(3-mercaptopropionate) with norbornyl diisocyanate (NBDI) or of pentaerythritol tetra(3-mercaptopropionate) with isophorone diisocyanate (IPDI) and oligomers of trimethylolpropane tri-(3-mercaptopropionate) (TPMP) with xylylene diisocyanate, of trimethylolpropane tri-(3-mercaptopropionate) with norbornyl diisocyanate (NBDI) or of trimethylolpropane tri(3-mercaptopropionate) with isophorone diisocyanate (IPDI). Preferably, in these oligomers, the ratio of mercaptopropionate and diisocyanate is 20:1 to 5:1, in order that the isocyanate groups are fully converted.

Example of PTMP/XDI:

| | |
|---|---|
| PTMP | molecular weight 488 g/mol, 4 SH groups |
| XDI | molecular weight 188 g/mol, 2 NCO groups |

Preparation of the oligomers: The polythiol is reacted fully in a stoichiometric excess with the isocyanate under protective gas. Monitoring by IR spectroscopy (NCO band at about 2262 cm$^{-1}$, detection limit at film thickness 50 µm is at about 0.02% by weight of free NCO)

PTMP/XDI 100+10 prepolymer: 13.0% of the SH groups have been converted.
PTMP/XDI 100+15 prepolymer: 19.5% of the SH groups have been converted.
PTMP/XDI 100+20 prepolymer: 26.0% of the SH groups have been converted.

The ratio of PTMP to XDI is guided by the viscosity of the prepolymers/oligomers that arise in the reaction, and which thus have a crucial effect on the viscosity of the resulting lacquer composition.

In an example embodiment, the thiol compound is thus an oligomeric thiourethane obtainable by reaction of at least one mercapto ester having two or more ester groups and two or more thiol groups with at least one di- or polyisocyanate, where the oligomeric thiourethane formed has two or more free thiol groups. Alternatively, in addition to a monomeric mercapto ester compound, an oligomeric thiourethane is added to the lacquer composition, where the oligomeric thiourethane is in turn obtainable by reaction of at least one mercapto ester having two or more ester groups and two or more thiol groups with at least one di- or polyisocyanate, where the oligomeric thiourethane has two or more free thiol groups. The oligomeric thiourethane may also be a mixture of two or more oligomeric thiourethanes. The oligomeric thiourethanes are preferably each obtainable as described above. An added oligomer or prepolymer, based on the total weight of the lacquer composition, is preferably added in an amount of 10-30% by weight.

In a further example embodiment, a filler is additionally added to the lacquer composition, which can reduce the shrinkage of the protective lacquer in the course of curing. This especially prevents detachment of the protective lacquer from a surface during the curing, so that, for example, in the case of an optics element, no lacquer traces of an absorber lacquer to be applied subsequently can get between the optical surface and the protective lacquer applied. An advantageous amount has been found to be 5-25% by weight of filler, based on the total weight of the lacquer composition, especially 10-20% by weight. A preferred filler is quartz flour or fused silica flour, especially silanized quartz flour or fused silica flour, preferably having an average particle size of 4-6 µm. Useful silanization coatings include alkyl-, glycidyl-, acryl-/methacryl- and mercaptosilanes. Preferred fillers are also polymers, especially polyvinylacetate, or ketone resins in pure or hydrogenated form, which makes it possible to keep the protective lacquer to be produced particularly flexible.

The lacquer composition may also comprise customary additives, for example stabilizers and photoinitiators. Stabilizers are free-radical scavengers that ensure that the mixture of the polyfunctional thiol compound and the compound having two or more carbon-carbon double bonds does not polymerize on its own. Preference is given to using sterically hindered hydroquinones or phenols; particularly preferred stabilizers are tert-butylhydroquinone and 2,6-di-tert-butyl-4-methylphenol (butylhydroxytoluene, BHT). Useful amounts of stabilizer have especially been found to be 0.2-3% by weight, based on the total weight of the lacquer composition.

In principle, it is possible to use solvents in order to regulate processing viscosity or else in order to assure homogeneous levelling after application of the protective coating. It is preferable that the lacquer composition of the invention contains little organic solvent in order that optical surfaces are not attacked. The lacquer composition of the invention especially comprises less than 1% by weight, based on the total weight of the composition, of organic solvent, more preferably less than 0.5% by weight, most preferably less than 0.1% by weight, and most preferably the lacquer composition is free of solvent.

An organic solvent is as usual a carbon-containing compound that can dissolve gases, liquids or solids without there being chemical reactions between the solvent and the substances dissolved. Organic solvents are sufficiently well-known to the person skilled in the art.

For the purposes of rapid processing, UV curing of the lacquer composition is particularly advantageous, by which it is possible to achieve sufficient curing within relatively short periods of time. In principle, thermal curing is also possible, or a combination of these. For UV curing, prior to the polymerization, customary photoinitiators are added, for example α-hydroxy ketones, for example Irgacure 1116, Irgacure 1173 and Irgacure 2959, preference being given to Irgacure 1173. In addition, α-amino ketones are also usable, for example Irgacure 369, Irgacure 379, Irgacure 907 and Irgacure 1300, benzyl dimethyl ketals, for example Irgacure 651, phenyl glyoxylates, for example Irgacure 754, monoacylphosphines, for example Irgacure TPO, and bisacylphosphines, for example Irgacure 819 and Irgacure 2100, and benzophenones. In the thermal curing, preference is given to using peroxides such as di-tert-butyl peroxide or dibenzoyl peroxide, and azo compounds such as azobisisobutyronitrile.

In addition, it is possible to add further additives, for example plasticizers or synthetic resins, in order to match the viscosity to the desired end use. In addition, it may be advantageous also to add a dye or colour pigment to the lacquer composition of the invention in order to make the protective lacquer better visualizable, for example in the process for producing optics elements. Seriplas Red X3B-TP and Sudan blue have been found to be particularly suitable. In this context, the dyes or pigments should have sufficient transparency at the respective excitation wavelength, e.g. 365 nm.

Further provided is a process for producing a protective lacquer, comprising the steps of polymerizing the lacquer composition of the invention, for example thermally or with the aid of light. The process of the invention for producing a protective lacquer especially comprises the steps of mixing the lacquer composition of the invention with a photoinitiator and then irradiating it with light at a wavelength of 450 nm to polymerize and cure the composition. Alternatively, the composition of the invention may be admixed with a customary free-radical initiator and heated (thermal polymerization).

Additionally provided is the use of the lacquer composition of the invention as protective lacquer, especially as protective lacquer on an optical surface of an optics element, especially in the production of the optics element. Also disclosed is a protective lacquer producible by polymerizing the lacquer composition.

Still further provided is an optics element having an optical surface, wherein at least part of the optical surface has a protective lacquer producible by polymerizing the lacquer composition. If part of a surface has a protective lacquer, this is understood to mean that at least part of the surface has been coated with a protective lacquer. It is preferable that the entire surface has been coated or covered with the protective lacquer. In a preferred embodiment of the invention, the optical surface is bounded by a peripheral elevated edge and the protective lacquer is introduced into the depression that results therefrom.

The optical surface of the optics element may be selectively covered with the protective lacquer producible from the lacquer composition. The surrounding region may be configured such that the application and the protective function of the protective lacquer is favoured. For example, the area may be extended in order to assure the protective function beyond the edge of the layer. It may also be advantageous to configure the surrounding edge as a peripheral elevation so as to form a depression, for example in the form of a trough that can accommodate the lacquer. This results in formation of a defined plug that covers both the layer to be protected and the boundary sidewalls. After the application of the optical layer, the liquid lacquer or the liquid reactive resin can then be introduced into the depression and cured. After the complete processing of the component, the plug along with any lacquers and layers applied thereto can be removed, exposing the previously applied optical layer intact.

In order to assure the protective function of the lacquer that can be pulled off, it may be advantageous to apply the protective lacquer beyond the edge of the actual functional layer. In order to achieve uniform adhesion or demoulding, the functional layer may also be made larger, such that the protective lacquer extends beyond the optically utilized region of the layer but covers a uniform surface. This can also be achieved in the form of a depression or a trough, in that the optical layer covers the entire inner surface of the trough.

The protective lacquer preferably has a thickness of 0.2-2.5 mm. The thickness is understood to mean a maximum thickness, for example the greatest height of the layer in the case of a protective lacquer in laminar form. Particular preference is given to a thickness of 0.5-1.5 mm.

The protective lacquer producible by polymerizing the lacquer composition is removable again by pulling it off. For simplification of the later removal, it may be helpful to incorporate a corresponding auxiliary into the protective lacquer polymer. Advantageously, a loop or pin may be embedded in, with which the protective lacquer to be removed can be pulled off.

The optics element may consist of the customary optical materials. These include mineral glasses and ceramic materials, and polymers in particular. Examples include thermoplastics such as PMMA (polymethylmethacrylate), PET (polyethyleneterephthalate), PC (polycarbonate), COP/COC (cycloolefin polymers/cycloolefin copolymers), PS (polystyrene), PA (polyamides), but also thermosets such as ADC (allyl diglycol carbonate), PUR (polyurethanes), PU (polyureas), PTU (polythiourethanes) and elastomers such as LSR (liquid silicone rubber).

The optics element may, for example, be a lens, prism, an optical element of imaging optics, projection optics or receiving optics, part of a microscope, etc. In an example embodiment, the optics element takes the form of spectacle glass for a display device that can be placed onto a user's head and produces an image, wherein the optics element has a front side and a rear side, the optical surface is an input surface and the optics element has an output section spaced apart from the input surface and a light-guiding channel suitable for guiding beams of light of pixels of the generated image that are input into the optics element via the input surface of the optics element within the optics element to the output section, from which they are output from the optics element. The input surface has a protective lacquer over at least part of its surface, producible by polymerizing the lacquer composition of the invention. The protective lacquer is a temporary protective lacquer, meaning that it is used in the production process for protection of optical surfaces, for example input surfaces, and removed again at a later stage.

Also provided is a display device having a holding device that can be placed onto a user's head, an image generating module that is fastened to the holding device and generates an image, and imaging optics that are fastened to the holding device, have an optics element and, in the state of the holding device in which it has been placed on the user's head, project the generated image in such a way that the user can perceive it as a virtual image.

The imaging optics may have the optics element as the sole optical element. However, it is also possible that the imaging optics comprise at least one further optical element as well as the optics element. The at least one further optical element may be spaced apart from the optics element or directly connected thereto (for example bonded or cemented).

The display device may have a control unit which activates the image generating module. The image generating module may in particular have a two-dimensional image generator, such as for example an LCD module, an LCoS module, an OLED module or a tilting mirror matrix. The image generator may have a plurality of pixels, which may for example be arranged in rows and columns. The image generator may be self-illuminating or not self-illuminating. The image generating module may in particular take such a form that it generates a monochromatic image or a multi-colored image. The display device may have further elements known to a person skilled in the art that are necessary for its operation.

It goes without saying that the aforementioned features and those yet to be explained below can be used not only in the combinations specified but also in other combinations or on their own, without departing from the scope of the present invention.

BRIEF DESCRIPTION OF THE DRAWINGS

The invention is explained in more detail below by way of example on the basis of the accompanying drawings, which also disclose features essential to the invention. For better clarity of illustration, the figures at least partly do not show a representation that is to scale and in proportion and do not use shading. The figures show.

Figure 1:
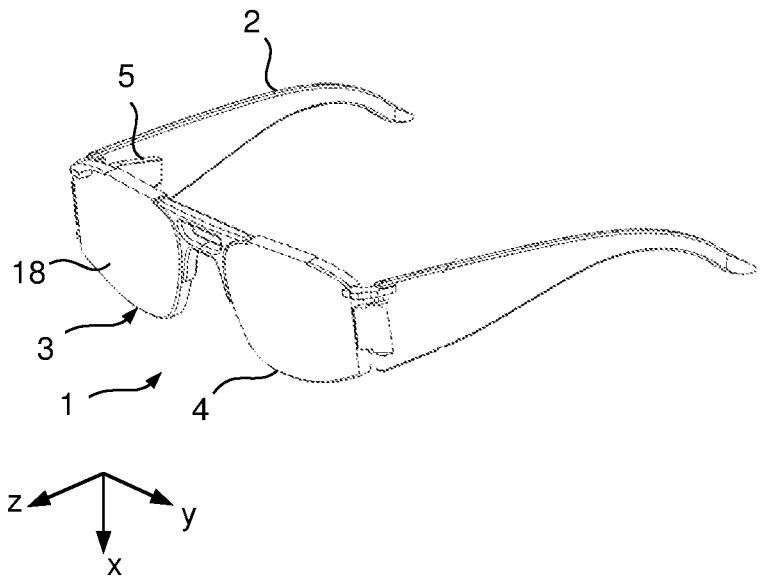
FIG. 1 one embodiment of the display device of the invention.

While the invention is amenable to various modifications and alternative forms, specifics thereof have been shown by way of example in the drawings and will be described in detail. It should be understood, however, that the intention is not to limit the invention to the particular example embodiments described. On the contrary, the invention is to cover all modifications, equivalents, and alternatives falling within the scope of the invention as defined by the appended claims.

DETAILED DESCRIPTION

In the following descriptions, the present invention will be explained with reference to various exemplary embodiments. Nevertheless, these embodiments are not intended to limit the present invention to any specific example, environment, application, or particular implementation described herein. Therefore, descriptions of these example embodiments are only provided for purpose of illustration rather than to limit the present invention.

In the case of the example embodiment shown in FIG. 1, the display device 1 of the invention comprises a holding device 2 that can be placed onto the head of a user and may take the form for example of a conventional spectacle frame, and also a first spectacle lens 3 and a second spectacle lens 4, which are fastened to the holding device 2. The holding device 2 with the spectacle lenses 3, 4 may take the form for example of sports goggles or spectacles, sunglasses and/or spectacles for correcting defective vision, it being possible for a virtual image to be introduced into the user's field of view via the first spectacle lens 3, as described below.

For this purpose, the display device 1 comprises an image generating module 5, which may be arranged in the region of the right-hand spectacle earpiece of the holding device 2, as schematically represented in FIG. 1. The image generating module 5 may have a two-dimensional image generating element 6 (FIG. 2), such as for example an OLED chip, an LCD chip or an LCoS chip or a tilting mirror matrix, with a multiplicity of pixels, for example arranged in columns and rows.

The spectacle lenses 3 and 4, and in particular the first spectacle lens 3, are described merely by way of example together with the display device 1 of the invention. The spectacle lenses 3, 4, or at least the first spectacle lens 3, each take(s) the form of a spectacle lens 3, 4 of the invention or of an optical element of the invention. The optical element of the invention may also be used in a different context than with the display device 1 described here. Therefore, if it takes the form of a spectacle lens, the optical element may of course also take the form of a second spectacle lens 4.

Figure 2:
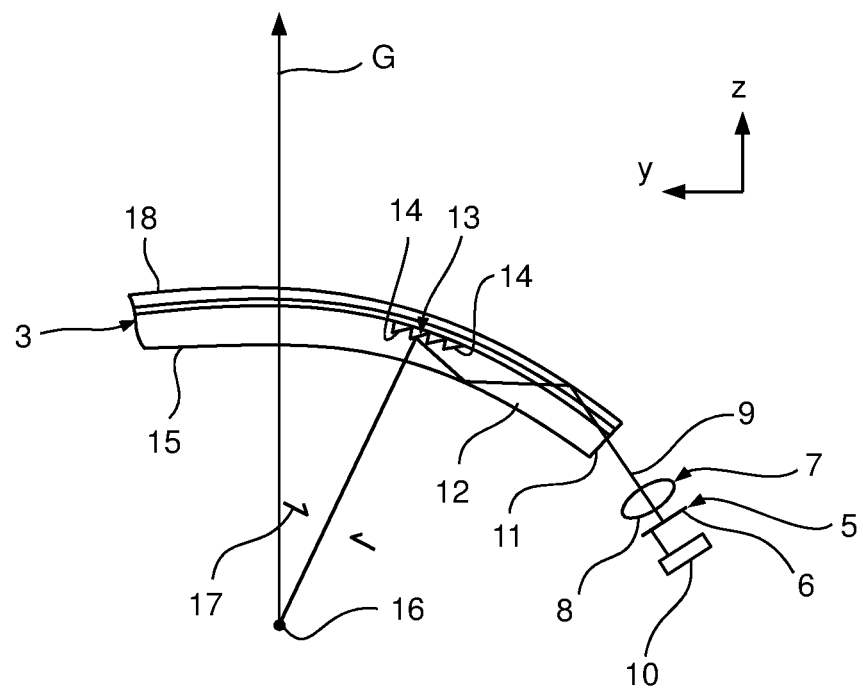
FIG. 2 an enlarged partial sectional view of the optics element 1 of the invention, including a schematic representation of the image generating module.

As can best be seen from the enlarged, schematic partial sectional view in FIG. 2, the display device 1 has imaging optics 7 which include an optics element 8 arranged between the image generating element 6 or the image generator 6 and the first spectacle lens 3. Furthermore, the first spectacle lens 3 itself also serves as part of the imaging optics 7.

A beam of light 9 may emanate from each pixel of the image generator 6. The desired image can be generated by appropriate activation of the pixels of the image generator 6 by means of a control unit 10, which may be part of the image generating module 5. In FIG. 2, the beam path of a light ray is depicted as representative of the beam of light 9, and so hereinafter reference is also made to the light ray 9.

The light ray 9 emanating from the image generator 6 passes through the optics element 8 and enters the first spectacle lens 3 via an input portion 11 or input surface 11 (here the end face of the first spectacle lens 3) and is guided in this spectacle lens along a light-guiding channel 12 to an output portion 13. The output portion 13 has a number of reflective deflecting surfaces 14 arranged next to one another (which may also be referred to as reflective facets), at which a reflection of the light rays 9 in the direction of a rear side 15 of the first spectacle lens 3 takes place, so that the light rays 9 emerge from the first spectacle lens 3 via the rear side 15. The input section 11 or input surface 11 can also be directly connected to the spectacle lens 3. In the production process, the input surface 11 or the input section 11 has been temporarily provided with the protective lacquer of the invention.

Consequently, a user wearing the display device 1 of the invention on his/her head as intended can perceive the image generated by means of the image generator 6 as a virtual image if he/she looks at the output portion 13. In the case of the embodiment described here, the user must look to the right by about 40°, based on the viewing direction G of looking straight ahead. In FIG. 2, the center of rotation 16 of the user's eye and also the eye-box 17 or the exit pupil 17 of the imaging optics 7 are depicted for purposes of illustration. The eye-box 17 is the region that is provided by the display device 1 and in which the user's eye can move and always still see the generated image as a virtual image.

Although in the case of the embodiment described the input is carried out via the end face of the first spectacle lens 3, and consequently the input portion 11 is formed on the end face of the first spectacle lens 3, it is also possible to carry out an input via the rear side 15 of the first spectacle lens.

As shown in the schematic representation in FIG. 2, both the rear side 15 and the front side 18 of the first spectacle lens 3 are formed in a curved manner.

The optics element can be produced as follows:

In a first step, a first semifinished product is produced from a thermoplastic polymer by injection molding. The first semifinished product can then be coated with an optically active layer within a microstructuring area. For this purpose, it is possible to use known coating processes, for example chemical vapor deposition (CVD) or physical vapor deposition (PVD). The depressions caused by the microstructuring, which extend from the second side into the semifinished product, may be filled in a subsequent step so as to obtain a smooth continuous second side. The depressions can be filled using the same material as for production of the semifinished product or else an optical cement or optical adhesive. It is especially possible to use the composition of the invention.

In the above-described production process, an optical surface, for example the input surface 11 or input section 11, may be provided with the protective lacquer of the invention and the protective lacquer may be removed again in or after the process.

In the case of the display device 1 of the invention, the virtual image is introduced into the user's field of view via the first spectacle lens 3. It is of course also possible for it to be introduced via the second spectacle lens 4. Furthermore, the display device 1 may take such a form that information or virtual images can be introduced via both spectacle lenses 3, 4. In this case, the introduction may take place in such a way that the impression of a three-dimensional image is created. However, this is not mandatory.

The holding device 2 need not take the form of a spectacle-like holding device. Any other kind of holding device by which the display device can be placed or worn on the user's head can take place is also possible.

The spectacle lens may be in two-shell form. However, it is also possible to produce the spectacle lens in one-shell form or with more than two shells, for example at least three shells.

More particularly, the spectacle lens may be produced from one or two parts (which need not necessarily be shells) or from more than two parts.

The examples which follow explain the invention.

The compositions which follow are produced by mixing the components of the respective examples at room temperature. Subsequently, irradiation was effected with UV-A light at a wavelength of about 365-400 nm, produced with the aid of a high-pressure Hg source, e.g. Hoenle Bluepoint 3, for example at 30-50 mW/cm$^2$ (milliwatts per square centimeter) for about 60 s or at 100-150 mW/cm$^2$ for 30 s. As alternative light source, it is also possible to use UV-LEDs having wavelengths of 365 nm, 375 nm, 385 nm, 395 nm or 405 nm. Preference is given to using UV-LEDs having wavelengths of 365 nm, 385 nm or 405 nm, e.g. Hoenle Bluepoint LED.

Example 1

100 MU TEMPIC
47 MU TTT
5 MU Irgacure 1173
3 MU BHT
3 MU 1-dodecylamine
0.02 MU Seriplas Red X3B-TP

Example 2

100 MU PTMP
68 MU TTT
5 MU Irgacure 1700
3 MU 1-dodecylamine
2 MU BHT

Example 3

100 MU TEMPIC
100 MU Silbond 600 RST
47 MU TTT
4 MU Irgacure 1173
3 MU Zelec UN
2 MU BHT

Example 4

100 MU PTMP/XDI (100+12) prepolymer
51 MU TTT
5 MU Zelec UN
4 MU Irgacure 1173
2 MU BHT

Example 5

90 MU prepolymer/XDI (100+12)
46 MU TTT
20 MU SK synthetic resin
2.5 MU Zelec UN
3 MU Irgacure 1173
2 MU BHT Explanations:

| | |
|---|---|
| MU | mass unit |
| BHT | butylhydroxytoluene; 2,6-di-tert-butyl-4-methylphenol |
| PTMP/XDI (100 + 12) prepolymer | prepolymer of pentaerythritol tetra(3-mercaptopropionate) and xylylene diisocyanate in a ratio of 100 + 12 |
| TEMPIC | tris[2-(3-mercaptopropionyloxy)ethyl] isocyanurate |
| TPMP | trimethylolpropane tri(3-mercaptopropionate) |
| TTT | 1,3,5-triallyl-1,3,5-triazine-2,4,6-trione |
| Zelec UN | di(n-dodecyl) hydrogenphosphate |
| SK synthetic resin | hydrogenated acetophenone/formaldehyde synthetic resin |
| Irgacure 1173, Irgacure 1700 | photoinitiators |
| Silbond 600 RST | silanized fused silica flour |

The above-described lacquer compositions from examples 1 to 5 produce rapidly curable protective lacquers that give good protection of optical surfaces and are removable again in an excellent manner.

While the invention has been described in connection with what is presently considered to be the most practical and preferred embodiments, it will be apparent to those of ordinary skill in the art that the invention is not to be limited to the disclosed embodiments. It will be readily apparent to those of ordinary skill in the art that many modifications and equivalent arrangements can be made thereof without departing from the spirit and scope of the present disclosure, such scope to be accorded the broadest interpretation of the appended claims so as to encompass all equivalent structures and products. Moreover, features or aspects of various example embodiments may be mixed and matched (even if such combination is not explicitly described herein) without departing from the scope of the invention.

The invention claimed is:

1. A lacquer composition, comprising:
   (A) 20-79.9% by weight, based on a total weight of the composition, of a thiol compound having two or more thiol groups;
   (B) 20-79.9% by weight, based on the total weight of the composition, of a compound having two or more carbon-carbon double bonds; and
   (C) 0.1-10% by weight, based on the total weight of the composition, of a separating agent having an alkyl radical having 4-20 carbon atoms, wherein the separating agent has a reactive functionality;
   wherein the alkyl radical is unsubstituted or fluorine-substituted, the alkyl radical is bonded to a functional group, the alkyl radical is an 1-alkyl-radical; the functional group is a thiol or mercaptan group (—SH) or a carbon-carbon double bond, and the separating agent is selected from a group consisting of alkyl mercaptan and alkene.

2. The lacquer composition of claim 1, wherein the thiol compound (A) is a mercapto ester having two or more ester groups and two or more thiol groups or a thioether having two or more thiol groups.

3. The lacquer composition of claim 1, wherein the thiol compound (A) is tris[2-(3-mercaptopropionyloxy)ethyl]isocyanurate or trimethylolpropane tri(3-mercaptopropionate) and/or component (B) is 1,3,5-triallyl-1,3,5-triazine-2,4,6-trione.

4. The lacquer composition of claim 1, wherein the thiol compound (A) is an oligomeric thiourethane obtained by reacting at least one mercapto ester having two or more ester groups and two or more thiol groups, where the oligomeric thiourethane has two or more free thiol groups.

5. The lacquer composition of claim 1, wherein the thiol compound (A) is an oligomeric thiourethane obtained by reacting at least one mercapto ester having two or more ester groups and two or more thiol groups and a thioether comprising two or more thiol groups with at least one di- or polyisocyanate, where the oligomeric thiourethane has two or more free thiol groups.

6. The lacquer composition of claim 1, wherein the lacquer composition additionally contains 5-25% by weight, based on the total weight of the composition, of a filler.

7. The lacquer composition of claim 1, wherein the separating agent includes an alkyl radical or multiple alkyl radicals, where the one or more alkyl radical(s) together have 7-20 carbon atoms.

8. A process for producing a protective lacquer, the process comprising:
   mixing the lacquer composition as claimed in claim 1 with a photoinitiator; and
   after mixing the lacquer composition, irradiating the lacquer composition with light at a wavelength of ≤450 nm to cure the composition.

9. An optics system, comprising:
   an optics element comprising an optical surface,
   wherein a protective lacquer is disposed on at least a portion of the optical surface, and
   wherein the protective lacquer comprises the composition of claim 1.

10. The optics system of claim 9, wherein the optical surface of the optics element is bounded by a peripheral elevated edge such that a depression is formed, and wherein the protective lacquer is disposed in the depression.

11. The optics system of claim 9, wherein the optics element is a component of a display device that can be placed onto a user's head and produce an image to the user,
   wherein the optical surface of the optics element is an input surface,
   wherein the optics element comprises a front side, a rear side, and an output section spaced apart from the input surface, and
   wherein the optics system further comprises a light-guiding channel, the light guiding channel configured to guide beams of light of pixels of the image that are input into the optics element via the input surface of the optics element within the optics element to the output section, from which they are output from the optics element.

* * * * *